United States Patent [19]
Fazio et al.

[11] Patent Number: 5,239,505
[45] Date of Patent: Aug. 24, 1993

[54] FLOATING GATE NON-VOLATILE MEMORY WITH BLOCKS AND MEMORY REFRESH

[75] Inventors: Albert Fazio, Los Gatos; Gregory E. Atwood, San Jose; Neal R. Mielke, Los Altos Hills, all of Calif.

[73] Assignee: Intel Corporation, Santa Clara, Calif.

[21] Appl. No.: 635,308

[22] Filed: Dec. 28, 1990

[51] Int. Cl.$^5$ ..................... G11C 13/00; G11C 11/40
[52] U.S. Cl. .................................... 365/185; 365/222
[58] Field of Search ....................... 365/185, 222, 182

[56] References Cited

U.S. PATENT DOCUMENTS 5,043,939 8/1991 Slamowitz et al. ................. 365/222

OTHER PUBLICATIONS

"21464 65,536×4 Dynamic RAM," Memory Components Handbook, pp. 3-58 through 3-71 (Intel Corp. Sep. 1989).

Primary Examiner—Terrell W. Fears
Attorney, Agent, or Firm—Blakely, Sokoloff, Taylor & Zafman

[57] ABSTRACT

A non-volatile memory device is described. The memory device includes a first block and a second block. The first block includes a first memory cell having a drain region, a source region, a floating gate, and a control gate. A first word line is coupled to the control gate of the first memory cell. The second block includes a second memory cell having a drain region, a source region, a floating gate, and a control gate. A second word line is coupled to the control gate of the second memory cell. A bit line is coupled to the drain region of the first and the second memory cell. A refresh control means performs a refresh operation on one of the first and second memory cell. A sensing means is coupled to the bit line, and has a first reference potential and a second reference potential for detecting a voltage state of the first and second memory cell during the refresh operation. When the voltage state is detected to fall between the first reference potential and the second reference potential, the sensing means generates a refresh signal to the refresh control means. When the refresh control means receives the refresh signal from the sensing means, the voltage state is raised above the second reference potential. A method of refreshing the non-volatile device is also described.

12 Claims, 5 Drawing Sheets

FIG._2

FLOATING GATE NON-VOLATILE MEMORY WITH BLOCKS AND MEMORY REFRESH

FIELD OF THE INVENTION

The present invention pertains to the field of non-volatile read-only memories. More particularly, the present invention relates to floating gate memory devices incorporating block erase and block refresh feature.

BACKGROUND OF THE INVENTION

Metal-oxide-semiconductor ("MOS") electrically programmable read-only memories ("EPROMs") frequently use memory cells that have electrically isolated gates (floating gates). Information is stored in the memory cells in the form of charge on the floating gates.

One type of prior EPROM is the flash erasable read-only memory ("flash EPROM"). One such flash EPROM cell is described in copending U.S. patent application Ser. No. 253,775, entitled "Low Voltage EEPROM Cell," filed on Oct. 5, 1988.

A typical flash EPROM has the same array configuration as a standard EPROM. The array is thus organized into rows and columns. Memory cells are placed at intersections of word lines and bit lines. Each word line is connected to the gates of a plurality of memory cells in one row. Each bit line is connected to the drains of a plurality of memory cells in one column. The sources of all the memory cells are connected to a common source line. The flash EPROM can be programmed by a user, and once programmed, the flash EPROM retains its data until erased. When programmed, the flash EPROM is programmed byte by byte. Once programmed, the entire contents of the flash EPROM can be erased by electrical erasure in one relatively rapid operation. A high erasing voltage is made available to the sources of all the cells in the flash EPROM simultaneously. This results in a full array erasure. The flash EPROM may then be reprogrammed with new data.

One disadvantage of this prior flash EPROM structure is the characteristics of array erasure. When changes are sought to be made to a program stored in the array, the entire array must be erased and the entire program must be rewritten into the array, even when the changes are minor.

One prior approach to solving this problem is to re-organize the array into blocks so that the high erasing voltage is made available only to the source of every cell within one block to be erased. By this arrangement, only a block of the memory array is erased, rather than having the entire memory array erased.

One disadvantage of this prior approach is that interference can arise from the blocked array configuration of the flash EPROM. This interference can be of two types. One type is referred to as drain disturbance. Drain disturbance arises because the drains of cells within a column are typically interconnected across a block boundary. Another type of interference is referred to as gate disturbance. Gate disturbance arises because the gates of cells within a row are typically interconnected across a block boundary.

An example of "gate disturbance" is as follows. A prior flash EPROM is divided into "bit line blocks" by organizing bit lines into groups. During programming of the flash EPROM, a high voltage Vpp (typically 12volts) is applied to the control gate of a selected cell in a selected block through a selected word line. A program voltage Vp (typically 7 volts) lower than Vpp is applied to the drain of the selected cell through the selected bit line. The sources of all the cells within the selected block are grounded during the operation. The gates of unselected cells along unselected word lines both in the selected block and in unselected blocks are grounded. The drains of unselected cells along unselected bit lines both in the selected block and in unselected blocks are either left floating or grounded.

In this situation, the unselected cells on the selected word line will have the high positive voltage $V_{PP}$ (i.e. 12 volts) coupled to their floating gates. An electric field is thus present across each of the unselected cells on the selected word line. The presence of the electric field across each of the unselected cells can cause movement of electrons to the floating gates. This increases the threshold of these unselected cells, causing those unselected cells to be slowly programmed. This is referred to as slow programming. Thus, gate disturbance can result in unwanted slow programming.

An example of "drain disturbance" is as follows. A prior flash EPROM is divided into "word-line blocks" by organizing word lines into groups. During programming of the flash EPROM, a high voltage Vpp of 12 volts is applied to the control gate of a selected cell in a selected block through a selected word line. A program voltage Vp of 7 volts is applied to the drain of the selected cell through a selected bit line. The drain of unselected cells on the selected bit line both in the selected block and in an unselected block will be coupled to the voltage Vp of 7 volts. The gates of the unselected cells will be grounded. This creates an electric field across each of the unselected cells on the selected bit line, which causes unwanted movement of electrons from the floating gate to the drain. Thus the threshold of each of the unselected cells is decreased by unwanted movement of electrons, causing those unselected cells to be slowly erased. This is referred to as slow erasing. Thus, drain disturbance can result in unwanted slow erasing.

"Gate disturbance" and "drain disturbance" are especially pernicious because their effects accumulate as programming and erasing of a selected block of a flash EPROM are repeated. Unwanted movement of electrons in certain unselected cells happens each time there is a program operation.

For gate disturbance, the thresholds of unselected cells keep increasing, and the unselected cells are slowly programmed. For drain disturbance, the thresholds of unselected cells keep decreasing, and the unselected cells are slowly erased. If the accumulated gate or drain disturbances reach a certain degree on an unselected cell, the state of the unselected cell can be completely altered. In other words, an unselected cell could be unintentionally programmed or erased over time.

SUMMARY AND OBJECTS OF THE INVENTION

One object of the present invention is to provide a non-volatile memory that is organized into blocks and that includes block erase feature.

Another object of the present invention is to provide a flash EPROM device in which the state of memory cells in one block can be periodically refreshed to prevent from being erased by the interference from memory cells of another block during a device operation.

A non-volatile memory device is described. The memory device includes a first block and a second block. The first block includes a first memory cell having a drain region, a source region, a floating gate, and a control gate. A first word line is coupled to the control gate of the first memory cell. The second block includes a second memory cell having a drain region, a source region, a floating gate, and a control gate. A second word line is coupled to the control gate of the second memory cell. A bit line is coupled to the drain region of the first and the second memory cell. A refresh control means performs a refresh operation on one of the first and second memory cell. A sensing means is coupled to the bit line, and has a first reference potential and a second reference potential for detecting a voltage state of the first and second memory cell during the refresh operation. When the voltage state is detected to fall between the first reference potential and the second reference potential, the sensing means generates a refresh signal to the refresh control means. When the refresh control means receives the refresh signal from the sensing means, the voltage state is raised above the second reference potential.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A flash EPROM of a preferred embodiment of the present invention includes a memory array organized into blocks. The memory array is comprised of memory cells. The memory cells are organized into columns and rows.

The memory array includes a plurality of bit lines that extend throughout each of the blocks. Each block of the memory array includes a plurality of word lines. Memory cells are arranged at intersection of the word lines and bit lines. The flash EPROM also includes a command register and a state control circuitry to control and perform the device operations (including programming and erasing) of the flash EPROM. The flash EPROM of the preferred embodiment further includes a refresh control circuitry for controlling the state control circuitry to initiate a refresh operation over the flash EPROM. The organization for the flash EPROM and the refresh control circuitry will be described in more detail below, in conjunction with FIGS. 2-5.

Figure 1:
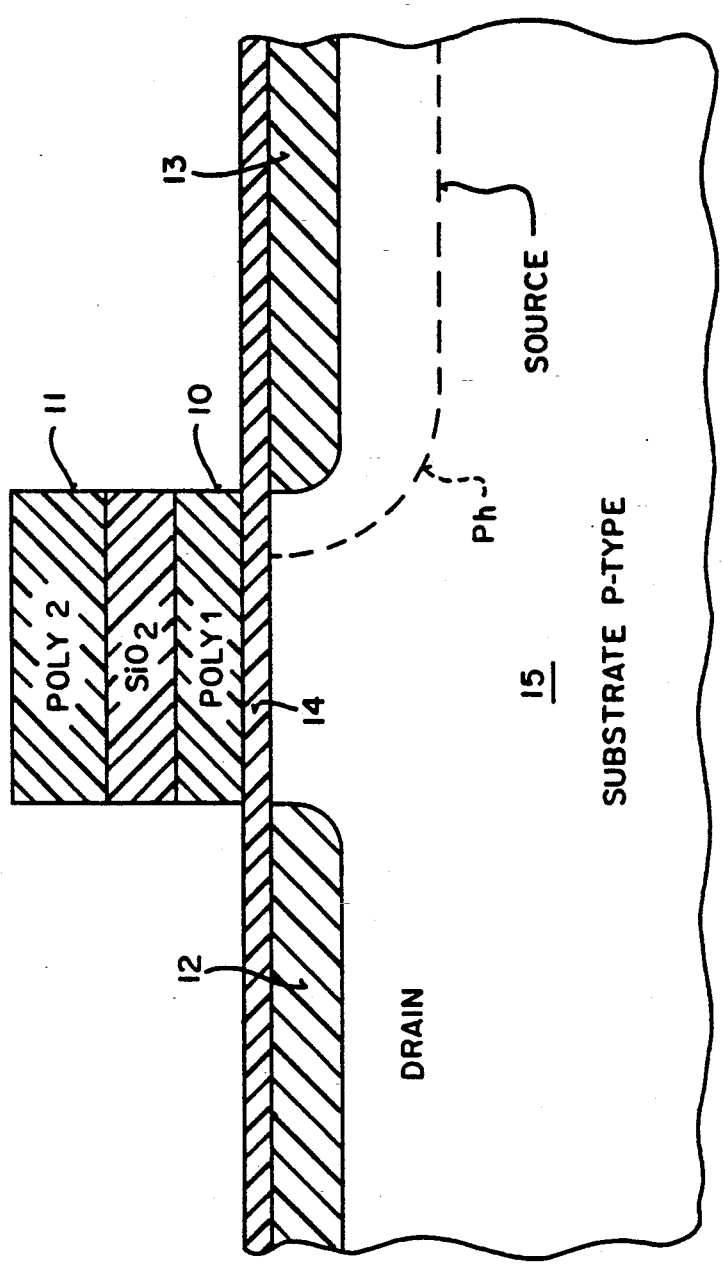
FIG. 1 is a cross-sectional view of a floating gate memory cell of a flash EPROM.

FIG. 1 shows the prior art memory cell that is included in the flash EPROM of the preferred embodiment of the present invention. The memory cell is formed on a silicon substrate such as the P-type substrate 15 of FIG. 1. The cell for FIG. 1 is shown in a partially fabricated state because this best reveals its structure.

The memory cell includes a pair of spaced-apart doped regions disposed in the substrate—specifically, a drain region 12 and a source region 13. A polysilicon floating gate 10 is generally disposed above and between these regions and insulated from these regions by a layer of silicon dioxide or other insulating layer 14. The floating gate 10 at the completion of the precessing is completely surrounded by insulating layers and hence, electrically floats. A second gate (control gate 11) is disposed above the floating gate 10. In the preferred embodiment, this gate is fabricated from a second layer of polysilicon. This control gate is a continuous polysilicon strip that forms a word line for the memory array of FIG. 2.

The memory cell of the preferred embodiment uses asymmetrically doped source and drain regions. The source and drain regions are both doped with an arsenic dopant and the source regions is additionally doped with a phosphorous dopant. Hence, the source region is more deeply doped. In addition, the source region overlaps the overlying floating gate. The use of these regions in programming and erasing is discussed in co-pending U.S. patent application Ser. No. 253,775, filed Oct. 5, 1988.

It will be appreciated that the cell of FIG. 1 may be fabricated using well-known NMOS technology or CMOS technology. The N-channel device illustrated in FIG. 1 may be fabricated directly in a P-type substrate or, when an N-type substrate is used may be fabricated in a P-type well formed in the substrate. Other variations such as employing both P-wells and N-wells are well-known in the art.

The memory cells are programmed (i.e., negatively charging the floating gate) by coupling the word line or control gate 11 to a potential of approximately +12 volts, the drain region to a potential of approximately +7 volts, and the source region to ground. With these conditions, channel hot electron injection occurs through the oxide layer 14 which layer is approximately 115 Å thick in the currently preferred embodiment.

To erase the cell, the drain region is floated, the word line or control gate 11 is grounded and a potential of approximately +12 volts is applied to the source region. Under these conditions, charge is tunnelled from the floating gate.

To read the cell, a positive potential less than that which would cause charge to transfer onto the floating gate is applied to the control gate (e.g., 5 volts) and a potential (e.g., 1 volt) is applied to the drain region. Current through the device is sensed to determine if the floating gate is or is not negatively charged. As with other floating gate cells, the negative charge on the floating gate shifts the threshold voltage of the cell making it less conductive. Thus, with a sense amplifier the presence or absence of charge on the floating gate can be determined. This defines if a cell is programmed with a binary one or zero.

Figure 2:
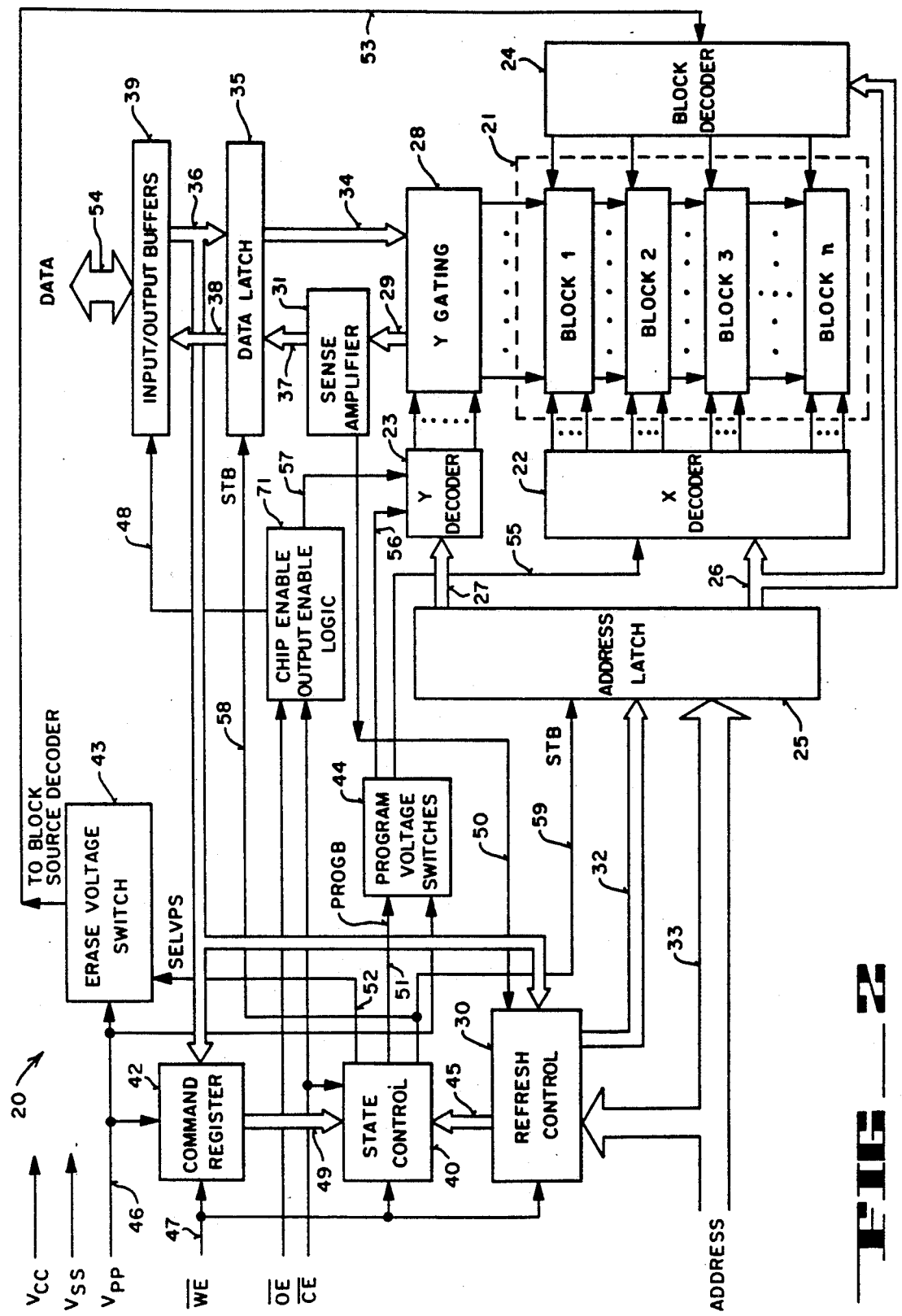
FIG. 2 is a block diagram of the layout of a flash EPROM, including the blocked memory array, the refresh control circuitry and the sense amplifier.

The layout of flash EPROM 20 is illustrated in block diagram form in FIG. 2, which implements a preferred embodiment of the present invention. Flash EPROM 20 includes memory array 21, which is made up of memory cells (not shown) that store data at addresses. In one embodiment, memory array 21 can store 1 MB (i.e., megabit) of data. In alternative embodiments, memory array 21 can be larger or smaller that 1 MB. In a preferred embodiment, flash EPROM 20 employs CMOS circuitry.

As can be seen from FIG. 2, memory array 21 of flash EPROM 20 is organized into blocks. In FIG. 2, BLOCK 1, BLOCK 2, BLOCK 3, and BLOCK n are intended to illustrate a plurality of blocks. Each block of blocks 1 through n includes a plurality of word lines. In one preferred embodiment, each block includes 128 word lines. In alternative embodiments, each block may include more or fewer than 128 word lines.

Each block of blocks 1 through n of flash EPROM 20 also includes a plurality of bit lines. The bit lines, unlike the word lines, are extending through all the blocks and therefore are shared commonly by cells in all the blocks.

Each block of blocks 1 through n has one common source line connected to it. Each of the common source lines is connected to the sources of all the memory cells within each of the blocks.

Flash EPROM 20 includes X decoder 22, Y decoder 23 and block decoder 24. X decoder 22 is the row decoder for memory array 21 and Y decoder 23 is the column decoder for memory array 21. X decoder 22 couples a number of word lines to each of blocks 1 through n, respectively. X decoder 22 receives X addresses from address latch 25 via bus 26. X decoder 22 then selects one word line within one block in accordance with each of the X addresses provided via bus 26 to undergo read or program operation.

Y decoder 23 is coupled, via Y gating 28, to all the bit lines that extend through all the blocks. Y decoder 23 receives its Y addresses from address latch 25 via bus 27. In one of read and program operation, Y decoder 23 selects one byte of bit lines (i.e., 8 bit lines) for each of the Y addresses applied. Y gating 28 is also coupled to a sense amplifier 31 via bus 29 and to a data latch 35 via bus 34.

Block decoder 24 is coupled to the common source lines for all the blocks. Block decoder 24 receives the X addresses from address latch 25 via bus 26 as its block address. Block decoder 24 selects one block by selecting the common source line associated with the selected block for any given X address. Given that each of blocks 1 through n has only one line coupled to block decoder 24, only a subset of the X addresses is required by block decoder 24 to determine which block has been selected and conversely which blocks are not selected. Thus, block decoder 24 may be an intermediate decoding stage of X decoder 22 used for selecting the word lines from the blocks. It is also true that block decoder 24 may be a separate decoder.

Figure 3:
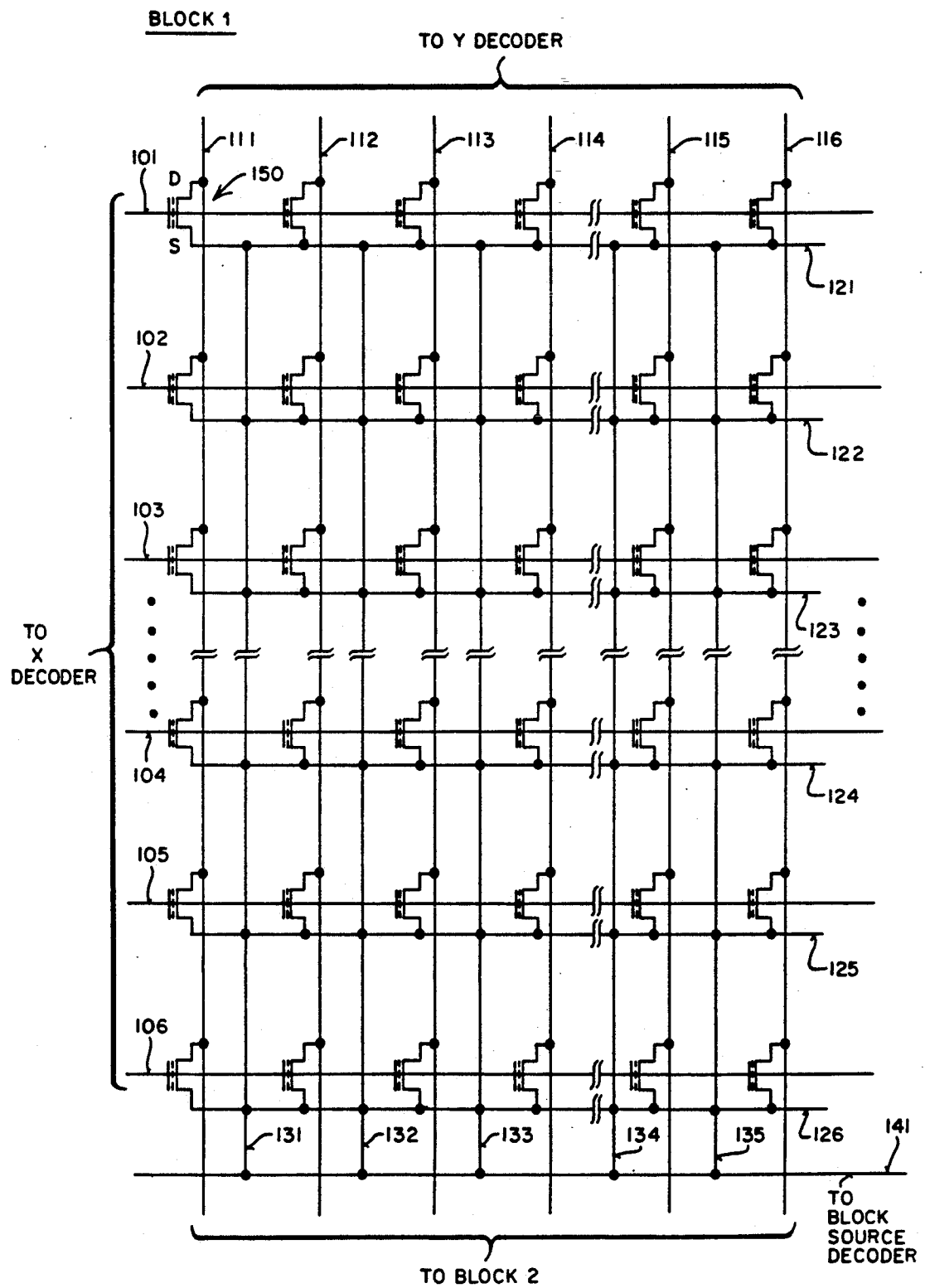
FIG. 3 illustrates the array configuration of one of the blocks of the flash EPROM.

Referring to FIG. 3, the array configuration of a block among blocks 1 through n of flash EPROM 20 is shown. FIG. 3 illustrates the array configuration of BLOCK 1. In FIG. 3, lines 101, 102, 103, 104, 105, and 106 are word lines which are all connected to X decoder 22 (shown in FIG. 2). Lines 111, 112, 113, 114, 115 and 116 are bit lines which are all connected to Y decoder 23 at one end and to BLOCK 2 at the other end (shown in FIG. 2). Lines 121, 122, 123, 124, 125 and 126 are first local source lines, and lines 131, 132, 133, 134 and 135 are second local source lines which connect all first local source lines to a common source line 141. Common source line 141 is connected to block source decoder 24 (shown in FIG. 2).

The memory cells within the block are formed at intersections of the word lines and the bit lines. Each of the memory cells has its control gate coupled to a word line and its drain region coupled to a bit line. The source region of each memory cell is coupled to a first local source line which intersects with many second local source lines. All second local source lines are coupled to the common source line. For example, memory cell 150 has its control gate connected to word line 101, its drain region coupled to bit line 111 and its source region to first local source line 121. All the bit lines 111–116 are extending throughout every one of the blocks 1 through n of flash EPROM 20 and all the second local source lines 131–135 which intersect every first local source lines 121–126 are coupled to the common source line 141.

The control gates of the memory cells in each of the blocks 1 through n are formed from continuous strips of polysilicon. The strips extend within the block to form the word lines 101–106. Thus, the word lines are formed by the polysilicon strips. The bit lines 111–116 are formed by continuous first metal layers which extend through all the blocks of flash EPROM 20. Each of the first local source lines 121–126 is formed by a diffusion layer and each of the second local source lines 131–135 is formed by the first metal layer extending only within the block. The first metal layer for each of the second local source lines 131–135 is placed above the diffusion layer and is in electrical contact with each of the diffusion layers of the first local source lines 121–126. Common source line 141 is formed by a continuous second metal layer which extends within the block. The second metal layer is placed above the first metal layers and is in electrical contact with the first metal layers of the second local source lines 131–135.

Read and programming of the memory cells of flash EPROM 20 with such blocked array configuration as shown in FIGS. 2 and 3 are accomplished in the same manner as that of a flash EPROM without the blocked array configuration as described above. For example, during the programming of flash EPROM 20, addresses are applied to X and Y decoders 22 and 23. X decoder 22 selects one word line for any X address applied and couples a high program voltage Vpp to the selected word line. Y decoder 23 selects one byte of bit lines for any Y address applied and couples another high program voltage Vp to the selected bit lines. The memory cells which are to be programmed have their drain regions and control gates coupled to the high program voltages Vpp and Vp through the selected word line and bit lines.

Erasure of memory cells in flash EPROM 20 can be made one block at a time. A block address is applied to block decoder 24 to decode the source line for the selected block. Block decoder 24 then couples a high erase voltage Vpp to the selected common source line for the block erase operation to the selected block. Only the sources of the memory cells of the selected block are coupled to the high erase voltage Vpp during the erase operation. The sources of the memory cells in the unselected blocks remain uncoupled to the high erase voltage Vpp, thereby achieving the blocked erasure of flash EPROM 20.

As can be seen from FIG. 3, all word lines 101–106 are extending within the block, all first and second local source lines 121–126 and 131–135 are extending within the block. Common source line 141 is the common source line for the block. Only the bit lines 111–116 are extending through all the blocks of flash EPROM 20. It is therefore apparent that with such array configuration, flash EPROM 20 is able to prevent gate disturbance occurring from cells in one selected block to cells in all other unselected blocks during a device operation. The drain disturbance, however, remains associated with such array configuration of flash EPROM 20. The function of flash EPROM 20 in the presently preferred embodiment to prevent the memory state of cells in all the unselected block from being erased by the drain disturbance will be described in more detail below, in conjunction with the description of FIGS. 2, 4, and 5.

Referring back to FIG. 2, Vpp is the erase/program power supply voltage for flash EPROM 20. Vcc is the device power supply for flash EPROM 20 and Vss is ground. In one embodiment, Vpp is approximately 12.0 volts and Vcc is approximately 5.0 volts.

In the absence of the high Vpp voltage on the Vpp input pin to flash EPROM 20, the device acts as a read-only memory. The data stored at an address supplied via address bus 33 and decoded by X and Y decoders 22 and 23 is read from memory array 21 and made available through sense amplifier 31 via buses 37, 38 and 54 to circuitry external to flash EPROM 20.

Flash EPROM 20 has two control functions—namely, chip enable $\overline{CE}$ and output enable $\overline{OE}$. Chip enable input $\overline{CE}$ is the power control and should be used for device selection of flash EPROM 20. The output enable input $\overline{OE}$ is the output control for flash EPROM 20 and should be used to gate data from the output pins from flash EPROM 20, independent of device selection. Both of the control functions $\overline{CE}$ and $\overline{OE}$ must be logically active to obtain data at the outputs of flash EPROM 20.

Flash EPROM 20 also includes a command register 42 and a state control circuitry 40 and a refresh control circuitry 30. Erasure and programming of flash EPROM 20 are accomplished via command register 42 and state control circuitry 40 when the high Vpp voltage is applied to line 46. Command register 42 is coupled to state control circuitry 40 via bus 49. The contents of command register 42 serve as an input to state control circuitry 40, which acts as an internal state machine. Refresh control circuitry 30 is coupled to state control circuitry 40 via bus 45. Refresh control circuitry 30 controls the refresh operation of flash EPROM 20. The function of refresh control circuitry 30, with respect to the operation of flash EPROM 20, will be described in more detail hereinafter.

Command register 42 itself does not occupy an addressable memory location. Instead, command register 42 is a latch used to store the command along with the address and data information needed to execute the command.

Command register 42 is alterable when voltage Vpp is at high voltage. When the high Vpp voltage is removed, the contents of command register 42 default to the read command, making the flash EPROM 20 a read-only memory. Command register 42 is written by an external microprocessor (not shown) which controls the device operation of flash EPROM 20. The command to be loaded into command register 42 is supplied to flash EPROM 20 from the external microprocessor. That command is supplied via buses 54 and 36 and via input/output buffers 39 to command register 42. The command is written to command register 42 by bringing a write enable signal $\overline{WE}$ to logical low level while the chip enable signal $\overline{CE}$ is low. The write enable signal $\overline{WE}$ is coupled to command register 42, state control circuit 40 and refresh control circuit 30. The write enable signal $\overline{WE}$ controls writes to command register 42 and the erase/program of memory array 21. The write enable signal $\overline{WE}$ is active low. Addresses are latched into address latch 25 on the falling edge of the write enable pulse. The rising edge of the write enable pulse latches the command and data into command register 42 and data latch 35 respectively, and initiates the erase/program operation. The write enable pulses $\overline{WE}$ are supplied by the external microprocessor. Standard microprocessor write timings are used in a preferred embodiment.

Device operations of flash EPROM 20, such as read, program or erase, are selected by writing specific commands into the command register 42 via buses 54 and 36. The commands may include erase command, erase verify command, program command, program verify command and read command, etc. While Vpp is high for erasure and programming, memory array 21 can be accessed via the read command as well.

State control circuitry 40 receives its input from command register 42 via bus 49. Another input of state control circuitry 40 is from refresh control circuitry 30 through bus 45. State control circuitry 40 controls the device operation of flash EPROM 20. It controls the erase/program operation by controlling the operation at erase voltage switch 43 and program voltage switch 44. It also controls the latching of addresses and/or data needed for programming and/or erase operation into address latch 25 and data latch 35.

One of the outputs of state control circuitry 40 is a STB signal, which is sent to address latch 25 and data latch 35 via lines 59 and 58 respectively. The STB signal controls the latching of addresses and data into address latch 25 and data latch 35.

Another output of state control circuitry 40 is an erase enable signal SELVPS, which is sent to erase voltage switch 43 via line 52. The high Vpp voltage is applied to erase voltage switch 43 via line 46. Erase voltage switch 43 passes the erase power supply Vpp from line 46 to block decoder 24 via line 53 when it receives the logical high erase enable signal SELVPS via line 52. Block decoder 24 applies the high erase power supply Vpp to the common source line of the block selected by the block address via bus 25. Electrical erasure of the selected block in memory array 21 then begins to erase all cells within the selected block. The common source lines for other unselected blocks remain at 0 volts.

When the erase enable signal SELVPS on line 52 becomes logical low, the erase power supply voltage Vpp on line 46 then is not passed to line 53, therefore the voltage on line 53 is switched to 0 volts. This terminates the erase operation of the selected block of memory array 21.

A further output of state control circuitry 40 is a program enable bar signal PROGB that is sent to program voltage switch 44 via line 51. The high Vpp voltage is also applied to program voltage switch 44 via line 46. When the program enable bar signal PROGB on line 51 is logical low, program voltage switch 44 passes the program voltage Vpp on line 46 through to lines 55 and 56. The program voltage Vpp is lowered on line 56 to Vp voltage. In the currently preferred embodiment, Vpp is approximately +12 volts and Vp is approximately +7 volts. The program voltages Vpp and Vp are thereby applied on lines 55 and 56 to X decoder 22 and Y decoder 23, respectively. With the X address applied via bus 26, X decoder 22 selects one word line and applies the Vpp voltage to the selected word line. Similarly, with the Y address applied through bus 27, Y decoder 23 selects a byte of bit lines and applies the Vp voltage to the selected bit lines. The presence/absence of the Vp voltage on the selected bit lines depends on the data to be programmed into memory array 21. The data are latched into data latch 35 via buses 54, 36 and via input/output buffers 39. Y gating 28 receives the data from data latch 35 via bus 34 and determines which of the selected bit lines should be applied with the Vp voltage.

Flash EPROM 20 includes a sense amplifier 31. Sense amplifier 31 is used in flash EPROM 20 to determine logical values of the data being read from memory cells addressed in a read operation. During a read operation, sense amplifier 31 is coupled to the selected bit lines via Y gating 28 and bus 29. Data being read from the addressed memory cells are coupled to sense amplifier 31 via the selected bit lines. Sense amplifier 31 compares each bit of the data with a reference potential developed by a dummy or reference cell, respectively, to sense the state of the cells and therefore to determine the logical values of the data being read. The data are then outputted to external circuitry via busses 37, 38 and 54 and via data latch 35 and input/output buffers 39.

Sense amplifier 31 employed in the currently preferred embodiment is also coupled to refresh control circuitry 30 via line 50 to signal to refresh control circuitry 30 whether the data read from memory array 21 for a given address need to be refreshed. For this purpose, a second elevated reference is provided in sense amplifier 31 in the presently preferred embodiment, the potential level of which is higher than the level of the above described reference potential used to determine the logic values of the memory cells. When sense amplifier 31 senses that a logical one information being read from a memory cell in memory array 21 is below the level of the second reference potential, it signals to refresh control circuitry 30 that the logic one information stored in the memory cell needs to be refreshed. This function of sense amplifier 31 will be described in more detail hereinafter, with reference to FIG. 5.

In alternative embodiments, other well known means, such as voltage detector, to determine if the state of a memory cell in flash EPROM 20 needs to be refreshed may be employed in sense amplifier 31.

Refresh control circuitry 30 controls the refreshing of flash EPROM 20 via state control circuitry 40. Refresh control circuitry 30 stores a read command and a program command. Refresh control circuitry 30 further includes a refresh address buffer that indicates the current refresh address. Refresh control circuitry 30 is also coupled to input/output buffers 39 via bus 36 to receive the commands from the external microprocessor. These commands are intended to be written into command register 42 for device operations. When an erase command is received at refresh control circuitry 30, the refresh operation to flash EPROM 20 will start immediately after the erase operation to a selected block is completed.

During the refresh operation, refresh control circuitry 30 first issues the read command to state control circuitry 40. The refresh address buffer applies the refresh address to address latch 25. The refresh address starts from the beginning address of memory array 21 and is incremented after each read operation. State control circuitry 40 then controls the reading of memory array 21 at the refresh address. Sense amplifier 31 then senses the logical values of the data being read and compares the data with the first and second reference potentials. If sense amplifier 30 detects that a memory cell being read stores a logical zero information and its threshold voltage falls below the elevated second reference potential, a refresh signal is generated at sense amplifier 31 and is sent to refresh control circuitry 30 via line 50. The data being read are latched to data latch 35. If refresh control circuitry 30 receives the refresh signal from sense amplifier 31, it means that the data being read need to be refreshed. Refresh control circuitry 30 then issues a program command to state control circuitry 40 to reprogram the data back into the same memory location addressed. If no refresh signal is received by refresh control circuitry 30, it means that no reprogram operation is needed for data stored at the memory location of this refresh address. The refresh address buffer is then incremented and the read operation is performed at the next refresh address. The same operation is repeated until the check for the entire memory array 21 is completed.

During the refresh operation, the block address for the erased block in the erase operation is also applied to refresh control circuitry 30 via address bus 33. Before each of the refresh addresses is sent to address latch 25 for the refresh operation, the refresh address is compared with the erased block address. If the refresh address falls within the erased block, refresh control circuitry 30 increments the refresh address to skip over the erased block. In this way, every memory location of memory array 21 except the cells in the erased block are checked and refreshed during the refresh operation.

Refresh control circuitry 30 can be implemented together with state control circuitry 40 as an internal state machine of flash EPROM 20. Refresh control can also be accomplished by having an on-chip microcontroller with operation commands (i.e., read and program commands) stored in it to control the refresh operation on flash EPROM 20. In a preferred embodiment, refresh control circuitry 30 is implemented along with the circuitry of flash EPROM 20 on a single substrate as is shown on FIG. 2. In an alternative embodiment, refresh control circuitry 30 is implemented by an external microprocessor or a device of the same effect with microcodes for the refresh operation of flash EPROM 20.

Figure 4:
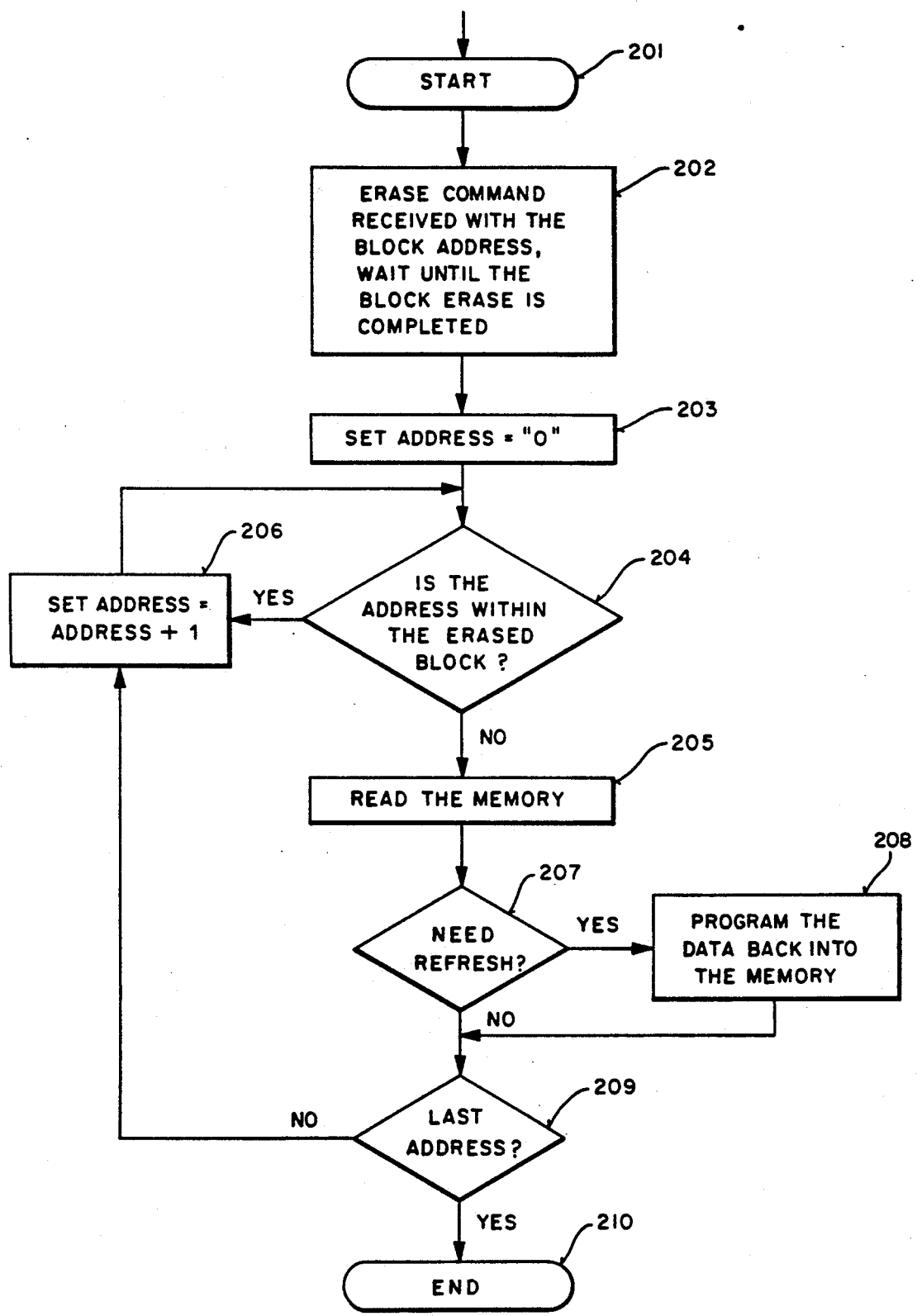
FIG. 4 is a flow chart that shows the process of refreshing the flash EPROM upon each block erase operation.

The process of the refresh operation to flash EPROM 20 is illustrated in the flow chart diagram of FIG. 4. In FIG. 4, the refresh process is invoked each time flash EPROM 20 receives an erase command to erase a selected block, as is described above. Steps 201 and 202 indicate the preliminary phase in which the signal for memory refresh (i.e., the erase command) of flash EPROM 20 is received in refresh control circuitry 30 and the refresh operation will begin as soon as the erase operation to the selected block is completed. Meanwhile, command register 42 receives the erase command and controls the state control circuitry 40 to start the erase operation. At step 203, the erase operation to the selected block is completed and the refresh operation begins. Refresh control circuitry 30 then sets its refresh address at "0" (i.e., the beginning address for flash EPROM 20). At step 204, refresh control circuitry 30 determines if its current refresh address is within the erased block by comparing the refresh address with the block address it receives via address bus 33 during the block erase operation. If the refresh address is determined to be within the erased block, then refresh control circuitry 30 increments the address at step 206 and the process goes back to step 204 for another check. If the refresh address is determined at step 204 to fall outside the erased block, refresh control circuitry 30 then applies the refresh address to address latch 25 at step 205. At step 205, refresh control circuitry 30 also applies a read command to state control circuitry 40. The data stored in the memory cells as addressed are then read by sense amplifier 31 to data latch 35. Sense amplifier 31 then determines, at step 207, whether the data read from the addressed memory cells need to be refreshed back. If the answer is "YES", refresh control circuitry 30 then issues, at step 208, a program command to state control circuitry 40 to program the data from data latch 35 back into the memory location as addressed. At this point, any electric change loss which may have occurred to the addressed memory cells due to the drain disturbance is thereby refreshed. The process then goes to step 209. If sense amplifier 31 determines that the addressed memory cells do not require a refresh at step 207, the process then skips to step 209. Step 209 is another judging step at which refresh control circuitry 30 checks if the refresh operation reaches the last address of flash EPROM 20. If it reaches the last address of flash EPROM 20, the refresh operation is terminated as step 210. If it does not reach the last address, the process goes to step 206, continuing the refresh check with the remaining memory cells of flash EPROM 20.

Figure 5:
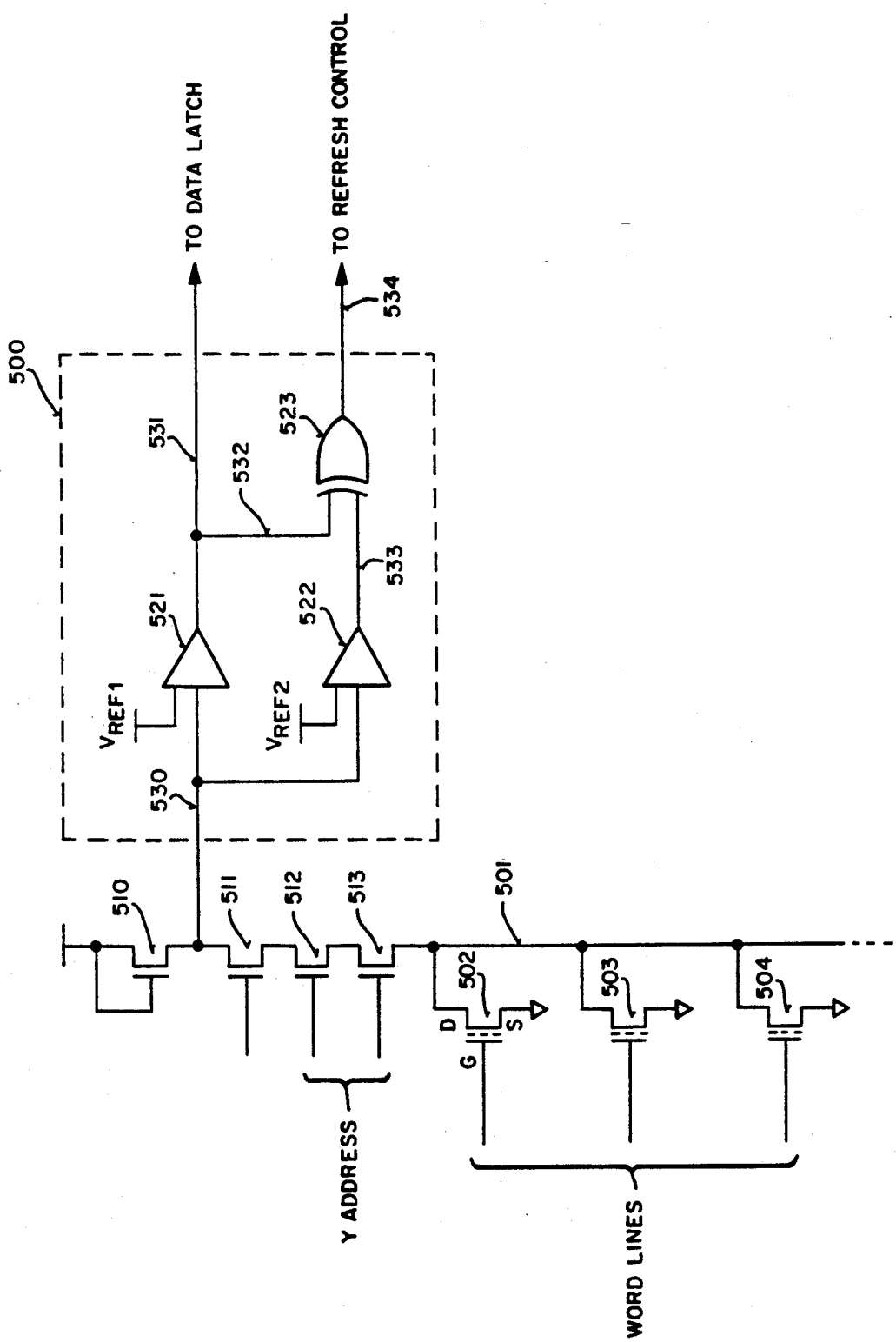
FIG. 5 is a schematic diagram of circuitry of the sense amplifier employed in the flash EPROM of FIG. 2.

FIG. 5 illustrates the circuitry diagram of a sense amplifier 500. In FIG. 5, sense amplifier 500 is coupled to a bit line 501 for sensing the data stored in any one of the memory cells coupled to the bit line 501. FIG. 5 also shows the standard configuration for the bit line 501, flash EPROM memory cells 502, 503 and 504 each has its drain region connected to the bit line 501. Transistors 512 and 513 are the decoding transistors for bit line 501, which are part of Y decoder 23. Transistor 510 is the load transistor and transistor 511 serves as the column bias, setting the output voltage level to sense amplifier 500. The output of the bit line 501 is applied to an input of two differential amplifiers 521 and 522 of sense amplifier 500 via line 530, respectively. When a memory cell coupled to the bit line 501 is addressed for reading, its output is coupled to the input of differential amplifiers 521 and 522 via line 530. Differential amplifier 521 is the normal sense amplifier to determine the logical value of the output data. Differential amplifier 521 compares the output voltage with a first reference voltage $V_{REF1}$ applied to its other input. If the voltage is lower than $V_{REF1}$, differential amplifier 521 outputs a logical zero signal. If the voltage is higher than $V_{REF1}$, differential amplifier 521 outputs a logical one signal. The output of differential amplifier 521 is applied to data latch 35 via line 531.

To determine if the addressed memory cell along the bit line 501 needs a refresh, a second elevated reference voltage $V_{REF2}$ is applied to differential amplifier 522. The voltage level of the second reference voltage $V_{REF2}$ is higher than that of the first reference voltage $V_{REF1}$. If the output voltage level of an addressed memory cell along the bit line 501 is lower than the second reference $V_{REF2}$, differential amplifier 522 outputs a logical zero signal. If the output voltage is higher than $V_{REF2}$, differential amplifier outputs a logical one signal. The output of both differential amplifiers 521 and 522 are coupled to exclusive OR gate 523 and 533, respectively. If either of its inputs is logical one signal, exclusive OR gate 523 applies a logical one signal to refresh control circuitry 30 via line 534. Given that the voltage level of $V_{REF2}$ is higher than that of $V_{REF1}$, the logical one only occurs when its input from differential amplifier 522 is logical zero while its input from differential amplifier 521 is logical one. With the two reference voltages $V_{REF1}$ and $V_{REF2}$, sense amplifier 500 is able to detect the memory cells that require refresh and send the refresh signal to refresh control circuitry 30. When a programmed cell along bit line 501 has its threshold voltage gone down below the voltage level of $V_{REF2}$ due to the drain disturbance, a refresh signal is developed at the output of exclusive OR gate 523 when the programmed cell is being addressed. The refresh signal indicates that the addressed cell needs to be refreshed. A refresh operation to the addressed cell is then performed to bring its threshold voltage back to the normal level (i.e., above +6 volts). If the threshold voltage of the programmed cell is above the second reference voltage $V_{REF2}$, the refresh signal will not be developed at the output of exclusive OR gate 523. A refresh operation to the addressed cell is thus determined unnecessary. In this manner, only the memory cells that require refresh are detected and are therefore refreshed. This reduces the overall refresh time for flash EPROM 20 and avoid any unnecessary refresh occurred to flash EPROM 20.

In the presently preferred embodiment, $V_{REF1}$ is approximately +4 volts and $V_{REF2}$ is approximately +6 volts. In alternative embodiments, $V_{REF2}$ may be higher or lower than +6 volts. Both reference voltages $V_{REF1}$ and $V_{REF2}$ can be provided by dummy or reference cells, or other well known reference voltage generators.

In the foregoing specification the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A non-volatile memory device comprising:
   (A) a first block comprising:
      (1) a first memory cell having a drain region, a source region, a floating gate, and a control gate;
      (2) a first word line coupled to the control gate of the first memory cell;
   (B) a second block comprising:
      (1) a second memory cell having a drain region, a source region, a floating gate, and a control gate;
      (2) a second word line coupled to the control gate of the second memory cell;
   (C) a bit line coupled to the drain region of the first memory cell and to the drain region of the second memory cell;
   (D) refresh control means for performing a refresh operation on one of the first memory cell and the second memory cell; and
   (E) sensing means coupled to the bit line and having a first reference potential and a second reference potential for detecting a voltage state of the one of the first memory cell and the second memory cell during the refresh operation, wherein when the voltage state is detected to fall between the first reference potential and the second reference potential, the sensing means generates a refresh signal to the refresh control means, wherein when the refresh control means receives the refresh signal from the sensing means, the voltage state is raised above the second reference potential.

2. The memory device of claim 1, wherein the first reference potential is approximately +4 volts and the second reference potential is approximately +6 volts.

3. The memory device of claim 1, wherein the refresh control means initiates the refresh operation to an unselected block of the first and second block upon an erase operation to a selected block of the first and second block.

4. The memory device of claim 1, wherein the refresh control means is a state machine storing commands for the refresh operation.

5. The memory device of claim 1, wherein the memory device is residing on a single substrate.

6. The memory device of claim 1, wherein the first and second word line are formed from strips of polysilicon, wherein each of which strips forms the control gate of the first and second memory cell along each of the first and second word line.

7. The memory device of claim 1, wherein the bit line is formed by a first metal layer strip.

8. The memory device of claim 1, further comprising a source decoder means coupled to the source region of the first and second memory cell via a first and second source line.

9. The memory device of claim 8, wherein the source region of the first memory cell is coupled to a first local source line, where in the first local source line is coupled to a second local source line which in turn is coupled to the first source line, wherein the source region of the second memory cell is coupled to a third local source line, wherein the third local source line is coupled a fourth local source line which is in turn coupled to the second source line, wherein the first local source line and the third local source line are formed by diffusion layer strips, wherein the second local source line and the fourth local source line are formed by first metal layer strips, wherein the first source line and the second source line are for med by second metal layer strips above the first metal layer strips.

10. A method of refreshing an electrically erasable and electrically programmable memory cell in a nonvolatile memory device having a plurality of blocks, the method comprising the steps of:
  reading an information stored in the memory cell by addressing the memory cell;
  detecting by comparing with a first reference voltage and a second reference voltage the voltage state of the memory cell; and
  programming the memory cell with the information read from the memory cell if the voltage state of the memory cell is detected to be between the first reference voltage and the second reference voltage.

11. The method of claim 10, wherein the step of reading the memory cell is triggered by an erase operation to a selected block of the memory array.

12. The method of claim 10, wherein the first reference potential is approximately +4 volts and the second reference is approximately +6 volts.

* * * * *